(12) United States Patent
Chu et al.

(10) Patent No.: US 6,301,965 B1
(45) Date of Patent: Oct. 16, 2001

(54) MICROELECTROMECHANICAL ACCELEROMETER WITH RESONANCE-CANCELLING CONTROL CIRCUIT INCLUDING AN IDLE STATE

(75) Inventors: Dahlon D. Chu, Albuquerque, NM (US); Donald C. Thelen, Jr., Bozeman, MT (US); David V. Campbell, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/461,062

(22) Filed: Dec. 14, 1999

(51) Int. Cl.[7] .................................................. G01P 15/13
(52) U.S. Cl. ..................................... 73/514.18; 73/514.21
(58) Field of Search ........................... 73/514.17, 514.18, 73/514.21, 514.32, 514.35, 862.61, 862.626; 361/280, 283.3

(56) References Cited

U.S. PATENT DOCUMENTS

| | | | |
|---|---|---|---|
| 4,467,651 | 8/1984 | Peters | 73/497 |
| 4,517,841 | 5/1985 | Peters | 73/517 AV |
| 4,766,768 | 8/1988 | Norling | 73/497 |
| 4,872,342 | 10/1989 | Hanson | 73/517 R |
| 4,945,765 | 8/1990 | Roszhart | 73/517 AV |
| 5,142,921 * | 9/1992 | Stewart et al. | 73/514.18 |
| 5,176,031 | 1/1993 | Peters | 73/516 R |
| 5,343,766 * | 9/1994 | Lee | 73/514.18 |
| 5,454,266 * | 10/1995 | Chevroulet et al. | 73/514.35 |
| 5,473,946 * | 12/1995 | Wyse et al. | 73/514.21 |
| 5,528,939 | 6/1996 | Martin | 73/702 |
| 5,563,344 | 10/1996 | Kaiser | 73/514.24 |
| 5,612,494 * | 3/1997 | Shibano | 73/514.18 |
| 5,635,638 | 6/1997 | Geen | 73/504.04 |
| 5,656,778 | 8/1997 | Roszhart | 73/504.04 |
| 5,783,340 | 7/1998 | Farino | 430/22 |
| 5,798,283 | 8/1998 | Montague | 438/24 |
| 5,919,548 | 7/1999 | Barron | 428/138 |
| 5,963,788 | 10/1999 | Barron | 438/48 |

OTHER PUBLICATIONS

M.A. Lemkin, *Micro Accelerometer Design with Digital Feedback Control*, (University of California, Berkeley, 1997—thesis available from University Microfilms).

* cited by examiner

*Primary Examiner*—Helen Kwok
(74) *Attorney, Agent, or Firm*—John P. Hohimer

(57) ABSTRACT

A digital feedback control circuit is disclosed for use in an accelerometer (e.g. a microelectromechanical accelerometer). The digital feedback control circuit, which periodically re-centers a proof mass in response to a sensed acceleration, is based on a sigma-delta ($\Sigma\Delta$) configuration that includes a notch filter (e.g. a digital switched-capacitor filter) for rejecting signals due to mechanical resonances of the proof mass and further includes a comparator (e.g. a three-level comparator). The comparator generates one of three possible feedback states, with two of the feedback states acting to re-center the proof mass when that is needed, and with a third feedback state being an "idle" state which does not act to move the proof mass when no re-centering is needed. Additionally, the digital feedback control system includes an auto-zero trim capability for calibration of the accelerometer for accurate sensing of acceleration. The digital feedback control circuit can be fabricated using complementary metal-oxide semiconductor (CMOS) technology, bi-CMOS technology or bipolar technology and used in single- and dual-proof-mass accelerometers.

46 Claims, 6 Drawing Sheets

MICROELECTROMECHANICAL ACCELEROMETER WITH RESONANCE-CANCELLING CONTROL CIRCUIT INCLUDING AN IDLE STATE

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates generally to accelerometers and to circuitry for the control and operation of accelerometers. In particular, the present invention relates to circuitry that incorporates a digital resonance-cancelling feedback control circuit including an "idle" state for the control and operation of single-proof-mass and dual-proof-mass accelerometers. The present invention also relates to single- and dual-proof-mass microelectromechanical (MEM) accelerometers incorporating such digital feedback control circuitry.

BACKGROUND OF THE INVENTION

Sensitive microelectromechanical (MEM) accelerometers are needed for navigation and other applications that operate with a range of acceleration from less than $\pm 10^{-3}$ g (where the term "g" is refers to the force of gravity on earth, and is approximately equal to 9.8 meters-second$^{-2}$) to about $\pm 10$ g or greater. Such sensitivity and enhanced dynamic range for MEM accelerometers necessitates a feedback control system that periodically re-centers a proof mass in the accelerometer.

An example of a feedback control system for a MEM accelerometer is described in a thesis by Mark A. Lemkin entitled *Micro Accelerometer Design with Digital Feedback Control* (University of California, Berkeley, 1997, available from University Microfilms). Lemkin's feedback control system is based on the generation of one of two possible states during each feedback cycle, including a "+1" state which provides a feedback voltage to urge the proof mass in one direction and a "−1" state which provides a feedback voltage to urge the proof mass in the other direction. Lemkin's feedback control system, therefore, necessarily requires that the proof mass be urged in one or the other direction during each feedback control cycle even in instances where no adjustment to the position of the proof mass is required or desirable (e.g. when the proof mass is correctly centered). This requirement that the proof mass be urged although such movement is not needed is disadvantageous since it can lead to incremental errors in navigational positioning which can accumulate over time.

The present invention provides an improvement over the two-level feedback control system of Lemkin by providing a three-level feedback control system having an "idle" state in which the position of the accelerometer proof mass is sensed and no feedback voltage is applied to re-center the proof mass during any feedback cycle wherein the proof mass is initially substantially centered (i.e. during which the acceleration of the proof mass falls below a predetermined threshold level).

An advantage of the present invention is that the accumulation of feedback errors over time are reduced, thereby improving the accuracy of the MEM accelerometer.

A further advantage of the present invention is that mechanical resonances of the proof mass are filtered out to provide a reduction in feedback errors associated with the mechanical resonances of the proof mass, thereby resulting in an improved sensitivity and stability of the feedback control system.

Another advantage of the present invention is that the MEM accelerometer and electronic feedback control circuitry can be formed on a single substrate (e.g. comprising silicon) to form a compact integrated single- or multi-axis accelerometer.

Yet another advantage is that a dual-proof-mass MEM accelerometer structure used in certain embodiments of the present invention can result in the cancellation of common-mode signals, thereby further enhancing the accuracy of the MEM accelerometer.

These and other advantages of the present invention will become evident to those skilled in the art.

SUMMARY OF THE INVENTION

The present invention relates to a digital feedback control circuit for use with an accelerometer structure having at least one proof mass which is moveable away from an initial position in response to an acceleration provided thereto. The digital feedback control circuit comprises an amplifier (e.g. a differential amplifier) that is operatively connected to sense the motion of each proof mass and generate therefrom an amplified signal indicative of the magnitude and direction of movement of each proof mass; a filter connected to the amplifier to receive the amplified signal and generate therefrom a filtered signal substantially free from a resonant-frequency component in the amplified signal resulting from a mechanical resonance of each proof mass; and a comparator for receiving the filtered signal and generating therefrom a digital feedback signal which is operatively coupled back to each proof mass to urge the proof mass towards its initial position. The feedback signal generated by the comparator is in one of three states during a force-feedback time interval, including a first state wherein the feedback signal urges each proof mass in one direction, a second state wherein the feedback signal urges each proof mass in the opposite direction, and a third state wherein the feedback signal is substantially equal to zero (i.e. null) and does not urge each proof mass in either direction. In the digital feedback control circuit of the present invention, the amplifier, filter and comparator are each formed from a plurality of interconnected transistors, with the transistors comprising, for example, complementary metal-oxide semiconductor (CMOS) transistors, which in some embodiments of the present invention can be formed on a common semiconductor substrate with the accelerometer structure.

The filter in the digital feedback control circuit can comprise a digital filter such as a switched-capacitor filter (e.g. a notch filter tuned to reject the resonance frequency component of the amplified signal). Additionally, the switched-capacitor filter preferably further includes at least one electronic integrator.

In some embodiments of the present invention, the accelerometer structure is a microelectromechanical (MEM) accelerometer structure formed on a semiconductor substrate. In these embodiments of the present invention, the digital feedback control circuit also comprises digital signal routing circuitry that routes electrical signals from a plurality of electrodes adjacent to each proof mass to the amplifier during a position-sense time interval, and routes the digital feedback signal back to the electrodes during a subsequent force-feedback time interval.

The present invention further relates to a microelectromechanical (MEM) accelerometer comprising at least one suspended proof mass formed on a semiconductor substrate (e.g. comprising silicon), with each proof mass being moveable away from an initial position in response to an applied acceleration; electrodes located on the substrate proximate to each proof mass to capacitively generate an electrical signal indicative of the magnitude and direction of the acceleration of that proof mass; a filter for receiving the electrical signal generated by the electrodes and generating therefrom a filtered signal having a resonance-frequency component of the electrical signal produced by a mechanical resonance of each proof mass removed; and electrical feedback means, electrically connected between the filter and the electrodes, for providing a feedback signal that is generated from the filtered signal to urge each proof mass towards its initial position after movement in response to the acceleration. The electrical feedback means operates digitally in response to a clock and provides the feedback signal to the electrodes, with the feedback signal during a force-feedback time interval (i.e. a predetermined number of clock cycles) having one of three states, including a first state wherein the feedback signal urges each proof mass in one direction, a second state wherein the feedback signal urges each proof mass in the opposite direction, and a third state (termed an "idle" state) wherein the feedback signal is nulled and does not urge each proof mass in either direction.

An amplifier (e.g. a differential amplifier) can be provided in the MEM accelerometer and electrically connected between the electrodes and the filter to amplify the electrical signal prior to filtering. The filter in the MEM accelerometer comprises a notch filter which can be formed digitally (e.g. as a digital switched-capacitor filter). Additionally, the filter can further include at least one electronic integrator.

The MEM accelerometer including the filter and electrical feedback means can be formed on a single semiconductor substrate (e.g. a silicon substrate), with the filter and electrical feedback means being located proximate to the proof mass(es). The proof mass(es) can be located above the substrate in some embodiments of the present invention. In other embodiments of the present invention, each proof mass can be located, at least in part, within a cavity formed into the substrate, or into a semiconductor layer deposited over the substrate. The filter and electrical feedback means can comprise, for example, complementary metal-oxide semiconductor (CMOS) circuitry (e.g. operating at a clock frequency of about 4 MHz and providing a readout of the acceleration experienced by the proof mass at a 500 kHz feedback cycle rate).

The present invention also relates to a dual-proof-mass MEM accelerometer comprising a pair of suspended proof masses formed on a semiconductor substrate (e.g. comprising silicon), with the proof masses being moveable in the same direction away from their initial positions in response to an applied acceleration; electrodes located on the substrate proximate to each proof mass to capacitively generate an electrical signal indicative of the magnitude and direction of the acceleration of the proof mass; a differential amplifier connected to the electrodes to amplify a difference component in the electrical signals generated by the pair of proof masses, thereby generating an amplified electrical signal; a filter for receiving the amplified electrical signal from the differential amplifier and generating therefrom a filtered signal having a resonance-frequency component of the electrical signal produced by mechanical resonances of the proof masses removed; and electrical feedback means, connected between the filter and the electrodes, for providing a feedback signal generated from the filtered signal to urge each proof mass towards its initial position after movement in response to the acceleration. The electrical feedback means operates digitally in response to a clock and provides the feedback signal to the electrodes, with the feedback signal during a force-feedback time interval having one of three states, including a first state wherein the feedback signal urges each proof mass in a forward direction, a second state wherein the feedback signal urges each proof mass in a backward direction, and a third state wherein the feedback signal is nulled and does not urge the proof masses in either the forward direction or the backward direction.

The filter in the dual-proof-mass MEM accelerometer comprises a notch filter tuned to reject the resonance-frequency component of the electrical signal. The notch filter can be implemented digitally (e.g. as a switched-capacitor filter) and can further include at least one electronic integrator.

The dual-proof-mass MEM accelerometer can be formed on a single semiconductor substrate, with the differential amplifier, filter and electrical feedback means being located proximate to the two proof masses. The location of the two proof masses can be above the substrate, in a cavity formed in the substrate, or in a cavity formed in a semiconductor layer grown or deposited over the substrate. The filter and electrical feedback means can comprise, for example, complementary metal-oxide semiconductor (CMOS) circuitry formed on the substrate or on the semiconductor layer grown or deposited over the substrate. The CMOS circuitry can operate at a clock frequency that is generally about 4 MHz, thereby providing a readout of the acceleration experienced by the proof masses at a data rate of about 500 kHz.

Finally, the present invention relates to a method for operating an accelerometer to sense an acceleration of a proof mass therein. The method comprises steps for capacitively sensing a movement of the proof mass from an initial position due to the acceleration, and generating an electrical signal containing information about the position of the proof mass at particular instants in time; filtering the electrical signal to remove a resonant-frequency component of the electrical signal arising from a mechanical resonance of the proof mass thereby generating a filtered signal; comparing the filtered signal to a voltage reference signal and generating a feedback signal during a force-feedback time interval comprising digital voltage pulses having one of three states, including a first state for urging the proof mass in a forward direction, a second state for urging the proof mass in a reverse direction, and a third state for providing a null signal and thereby urging the proof mass to remain in place; and generating an indication of the acceleration from the feedback signal. The method of the present invention can further include a step for amplifying the electrical signal prior to the step for filtering the electrical signal.

The step for filtering the electrical signal to remove the resonant component preferably comprises filtering the electrical signal with a notch filter, with the notch filter generally comprising a switched-capacitor notch filter which can be implemented as a digital circuit. The step for generating the indication of the acceleration from the feedback signal preferably includes counting the digital voltage pulses.

In embodiments of the present invention wherein the accelerometer is a microelectromechanical (MEM) accelerometer, the step for generating the feedback signal preferably includes electrostatically coupling the feedback signal to the proof mass to urge the proof mass to return to its initial position as needed.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
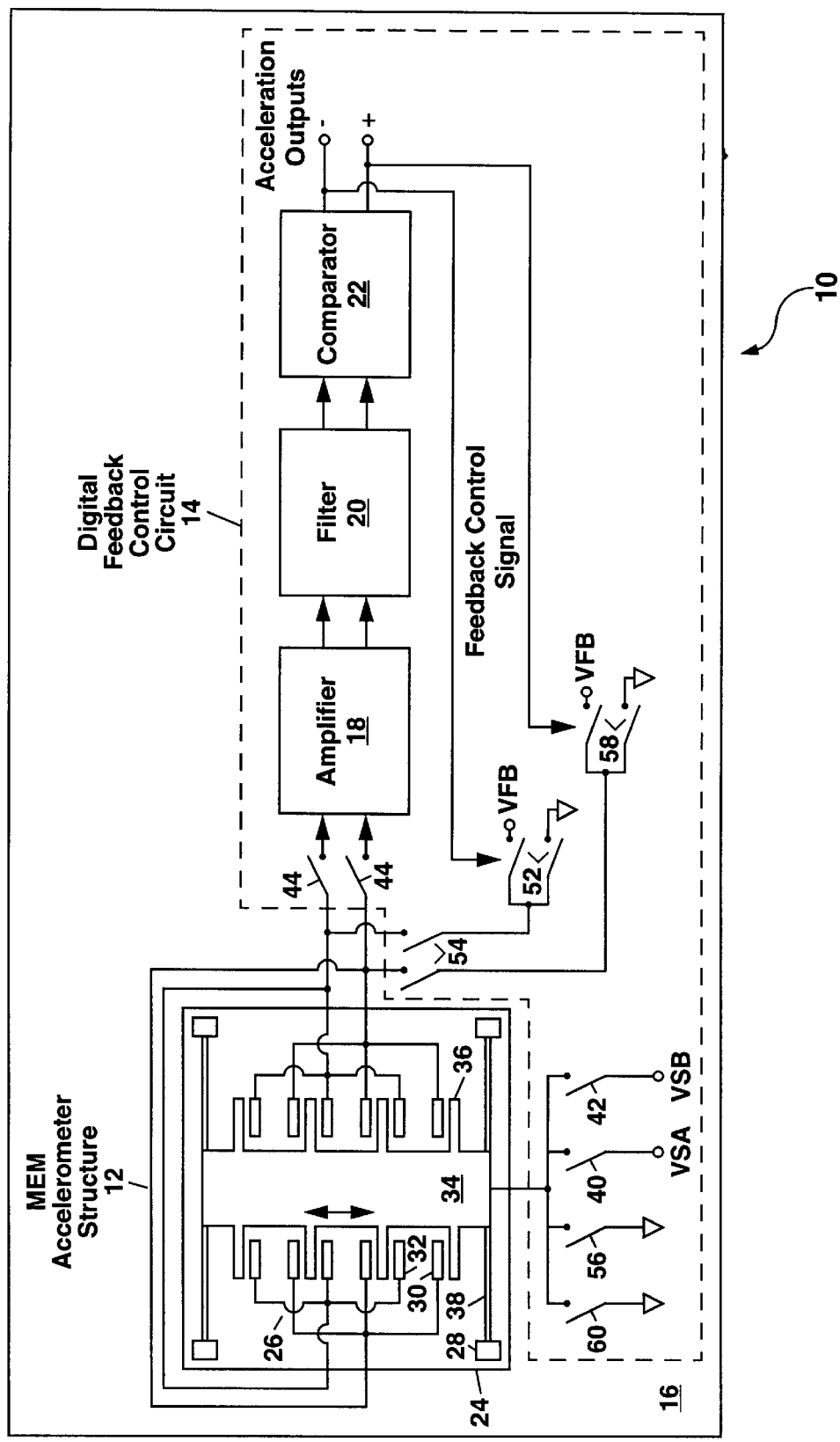
FIG. 1 shows schematically an example of a single-proof-mass MEM accelerometer including the digital feedback control circuit of the present invention.

Referring to FIG. 1, there is shown schematically a first example of an integrated microelectromechanical (MEM) accelerometer 10 that comprises a single-proof-mass MEM accelerometer structure 12 and a digital feedback control circuit 14 integrated onto a common substrate 16. The digital feedback control circuit 14, which is shown as a block diagram in FIG. 1, further comprises an interconnected amplifier 18, filter 20 and a comparator 22.

In the example of FIG. 1, the substrate 16 comprises a semiconductor, preferably monocrystalline silicon. The term "substrate" as used herein is defined to include both a monocrystalline silicon wafer and a monocrystalline silicon wafer having one or more layers of silicon epitaxially grown thereupon. Thus, the substrate 16 can include one or more epitaxial semiconductor layers formed thereon (including doped and undoped layers) with a total layer thickness of about 2–10 μm or more for providing a smooth low-defect-density upper surface (also termed a device surface) suited for formation of electronic circuitry comprising a plurality of interconnected transistors (e.g. CMOS transistors) for forming the digital feedback control circuit 14.

The substrate can be undoped or n- or p-type doped depending on a predetermined set of standard processes (and including design rules) to be used for fabricating the digital feedback control circuit 14. As an example, an n-type substrate 16 can be used for forming the digital feedback control circuit 14 by one set of standard complementary metal-oxide-semiconductor (CMOS) process steps having 2-μm design rules; whereas to fabricate the digital feedback control circuit 14 by another set of standard CMOS processing steps having 0.5-μm design rules, a p-type substrate is preferred.

In the example of FIG. 1, the single-proof-mass MEM accelerometer structure 12 can be fabricated within an open cavity 24 etched into an upper surface of the substrate 16. This allows the structure 12 to be fabricated and encapsulated and the substrate 16 to be globally planarized prior to fabrication of the digital feedback control circuit 14. Techniques for fabricating MEM devices within an open cavity formed in a substrate and subsequently forming electronic circuitry on a device surface of the substrate are well-known in the art (see e.g. U.S. Pat. Nos. 5,783,340; 5,798,283; 5,919,548 and 5,963,788 all of which are incorporated herein by reference). Single-proof-mass accelerometers fabricated by surface micromachining are also well-known in the art (see e.g. thesis by Mark A. Lemkin previously cited).

In the example of FIG. 1, the MEM accelerometer structure 12 is formed within the cavity 24 using conventional surface micromachining processes. The standard building-block processes for surface micromachining are deposition and photolithographic patterning of alternate layers of low-stress polycrystalline silicon (also termed polysilicon) and a sacrificial material (e.g. silicon dioxide or a silicate glass). Typical in-plane lateral dimensions of functional elements of the MEM accelerometer structure 12 can range from one micron to several hundred microns or more, while individual layer thicknesses are typically about 1–3 microns. Because the entire process is based on standard IC fabrication technology, a large number of fully assembled devices can be batch-fabricated on a silicon substrate without any need for piece-part assembly.

The substrate 16 is initially prepared for fabrication of the MEM accelerometer structure 12 by blanketing the substrate 16 with a layer of thermal oxide (several hundred nanometers thick) formed by a conventional wet oxidation process at an elevated temperature (e.g. 1050° C. for about 1.5 hours). A layer of low-stress silicon nitride (e.g. 500–800 nanometers thick) can then be deposited over the thermal oxide layer using low-pressure chemical vapor deposition (LPCVD) at about 850° C. The thermal oxide and silicon nitride layers (not shown) provide electrical isolation from the substrate 16 for a subsequently-deposited first polysilicon layer (termed Poly-0) used to form a ground plane underneath the MEM accelerometer structure 12 and to form electrical interconnections to, from and between various elements of the structure 12.

The Poly-0 layer, which can be about 300 nanometers thick, is deposited by LPCVD at about 580° C. to blanket the substrate 18 and the thermal oxide and silicon nitride layers. Phosphorous doping can be used to make the Poly-0 layer and other polysilicon layers electrically conductive as needed. The Poly-0 layer can then be patterned and etched to form the ground plane (not shown in FIG. 1) and an electrical distribution network 26 for signal routing. The term "patterned" as used herein means a series of process steps including applying a photoresist to a surface of the substrate 16 or a layer thereon, pre-baking the photoresist, aligning the layer covered with photoresist with a photomask (also termed a reticle), exposing and developing the photoresist to remove the photoresist at locations where particular features (e.g. one or more cavities 24) are to be formed, etching downward into or through a portion of the layer not protected by the photoresist, and removing the remaining photoresist so that further processing can take place. The term "patterned" can further include the formation and removal of a hard mask as needed during fabrication of the MEM accelerometer structure 12.

After deposition and patterning, the Poly-0 layer can be annealed at a high temperature (e.g. at about 1100° C. for three hours) to remove any stress therein. A separate annealing step can be performed after deposition and patterning of each subsequent polysilicon layer.

A first layer of sacrificial material about 1-μm thick can be blanket deposited to cover the Poly-0 layer and the substrate 18 and patterned to provide openings down to the silicon nitride layer or to the Poly-0 layer at the locations of a plurality of support posts 28 and stationary electrodes 30 and 32. The first layer of sacrificial material can comprise silicon dioxide ($SiO_2$) or a silicate glass (e.g. a plasma-enhanced CVD oxide, also termed PECVD oxide; or a silicate glass deposited from the decomposition of tetraethylortho silicate, also termed TEOS, by LPCVD at about 750° C. and densified by a high temperature processing).

A second polysilicon layer (termed Poly-1) can be used to form elements of the MEM accelerometer structure 12 including a single proof mass 34 having a plurality of moveable electrodes 36 extending laterally outward therefrom, a plurality of suspension springs 38, the support posts 28 and the stationary electrodes 30 and 32. The Poly-1 layer can be about 1–6 μm thick depending upon the type and sensitivity of the MEM accelerometer structure 12 to be formed. After formation of the MEM accelerometer structure 12 within the cavity 24, one or more additional layers of the sacrificial material can be deposited to overfill the cavity 24 and thereby encapsulate the structure 12 during formation of the digital feedback control circuit 14. The substrate 16 can then be globally planarized (e.g. by chemical-mechanical polishing) to provide a substantially planar surface upon which to fabricate the digital feedback control circuit 14.

In the example of FIG. 1, the digital feedback control circuit 14 comprises a sigma-delta ($\Sigma\Delta$) negative feedback control loop which is clocked to sense movement of the proof mass 34 away from its initial position and then to apply an electrostatic force, if necessary, during a force-feedback time interval to urge the proof mass 34 back towards its initial position. The digital output from the feedback control circuit 14 provides a measure of the electrostatic force necessarily to periodically restore the proof mass 34 to its initial position which is substantially equal to the force of acceleration experienced by the proof mass 34. By measuring and accumulating pulses from the digital output from the feedback control circuit 14 over time, a history of the acceleration experienced by the proof mass 34 along a particular directional axis can be assembled. Such history is useful, for example, for navigational purposes (e.g. using multiple MEM accelerometers 10 formed on the same substrate 16 or on different substrates).

The digital feedback control circuit 14 shown in block-diagram form in FIG. 1 can be fabricated using standard integrated circuit (IC) processes as known to the art. The circuit 14 is digital so that it can be fabricated from a plurality of switching transistors, resistors and capacitors interconnected by one or more layers of a patterned metallization. During formation of the digital feedback control circuit 14 interconnections to the MEM accelerometer structure 12 can be made as indicated in FIG. 1. The transistors used in the digital feedback control circuit 14 are preferably CMOS transistors, although those skilled in the art will understand that the digital feedback control circuit 14 can also be fabricated using bipolar CMOS (BiCMOS) transistors or bipolar transistors.

After fabrication of the digital feedback control circuit 14, the MEM accelerometer structure 12 can be released for movement and operation by removing the sacrificial material, at least in part, from the cavity 24. This can be done using a selective etchant comprising hydrofluoric acid (HF) which does not substantially attack the various polysilicon layers. For embodiments of the present invention wherein the MEM accelerometer structure 12 is to be sealed within the cavity by a deposited overlayer (e.g. comprising silicon nitride), a plurality of etch access holes can be formed through the overlayer to provide access of the underlying sacrificial material to the selective etchant. Once released, the completed device 10 can then be packaged.

In FIG. 1, the single proof mass 34 is responsive to an applied acceleration and moves bidirectionally along a substantially linear path as indicated by the double-headed arrow while suspended by springs 38 which limit the direction and extent of movement of the proof mass 34. Generally, the proof mass 34 within a single MEM accelerometer 10 is limited to linear motion about a single axis as shown in the example of FIG. 1. In FIG. 1, this can be done, for example, by stiffening the springs 38 (e.g. by making the springs with a width much smaller than the height of the springs 38) so that vertical movement of the proof mass 34 is limited. In other embodiments of the present invention multiple MEM accelerometers with different size proof masses 34 can be formed to operate along the same axis and sense acceleration over different ranges, thereby providing an increased dynamic range for acceleration measurement. In yet another embodiment of the present invention, a multi-axis MEM accelerometer can be formed by combining a plurality of individual MEM accelerometers 10, each tailored to detect acceleration along a different direction of motion or rotation. Such a multi-axis MEM accelerometer can be formed either on a common substrate 16, or on a plurality of substrates 16 with the individual MEM accelerometers providing acceleration outputs to a signal processing and readout unit.

As the proof mass 34 moves away from its initial position in response to an applied acceleration, the moveable electrodes 36 on the proof mass 34 move relative to the stationary electrodes 30 and 32. This alters the spacing between the moveable electrode 36 and the stationary electrodes 30 and 32, thereby altering the capacitance between the various electrodes. By sensing this change in capacitance with the digital feedback control circuit 14, the position of the proof mass 34 can be determined over time to provide a measure of the applied acceleration. Additionally, the sensitivity of the MEM accelerometer 10 is increased by ganging the various electrodes 30, 32 and 36. Although only a few individual electrodes 30, 32 and 36 are shown in FIG. 1, an actual device 10 can have up to hundreds of individual electrodes 30, 32 and 36 operating in parallel. The dimensions of the electrodes 30, 32 and 36 can be, for example, 100–200 μm in length, 2–5 μm wide and 1–6 μm thick.

In the example of FIG. 1, the digital feedback control circuit 14 comprises an amplifier 18, a filter 20 and a comparator 22. These block elements of the circuit 14 will be described in detail hereafter with reference to a timing diagram shown in FIG. 2. It should be noted that FIG. 1 is illustrative only and is not intended to show the state of the MEM accelerometer 10 (including switch positions) during any particular time interval.

In FIG. 1, the amplifier 18 senses and amplifies a capacitively generated electrical signal from the stationary electrodes 30 and 32. The capacitively generated electrical signal is induced on electrodes 30 and 32 by applying a changing voltage, $\Delta V$, to the proof mass 34 which is electrically connected to the moveable electrodes 36. This can be done by applying a first measurement voltage (denoted herein as "VSA") to the proof mass 34 (e.g. through one or more of the springs 38) during a first sensing time interval (denoted herein as "SEN1" and shown in FIG. 2C) and a second measurement voltage (denoted herein as "VSB") to the proof mass 34 during a second sensing time interval (denoted herein as "SEN2" and shown in FIG. 2D). The voltage change, ΔV, is then equal to the difference in the values of "VSA" and "VSB". As an example, "VSA" can be equal to −1 volt; and "VSB" can be equal to +1 volt to give ΔV =2 volts.

Figure 3:
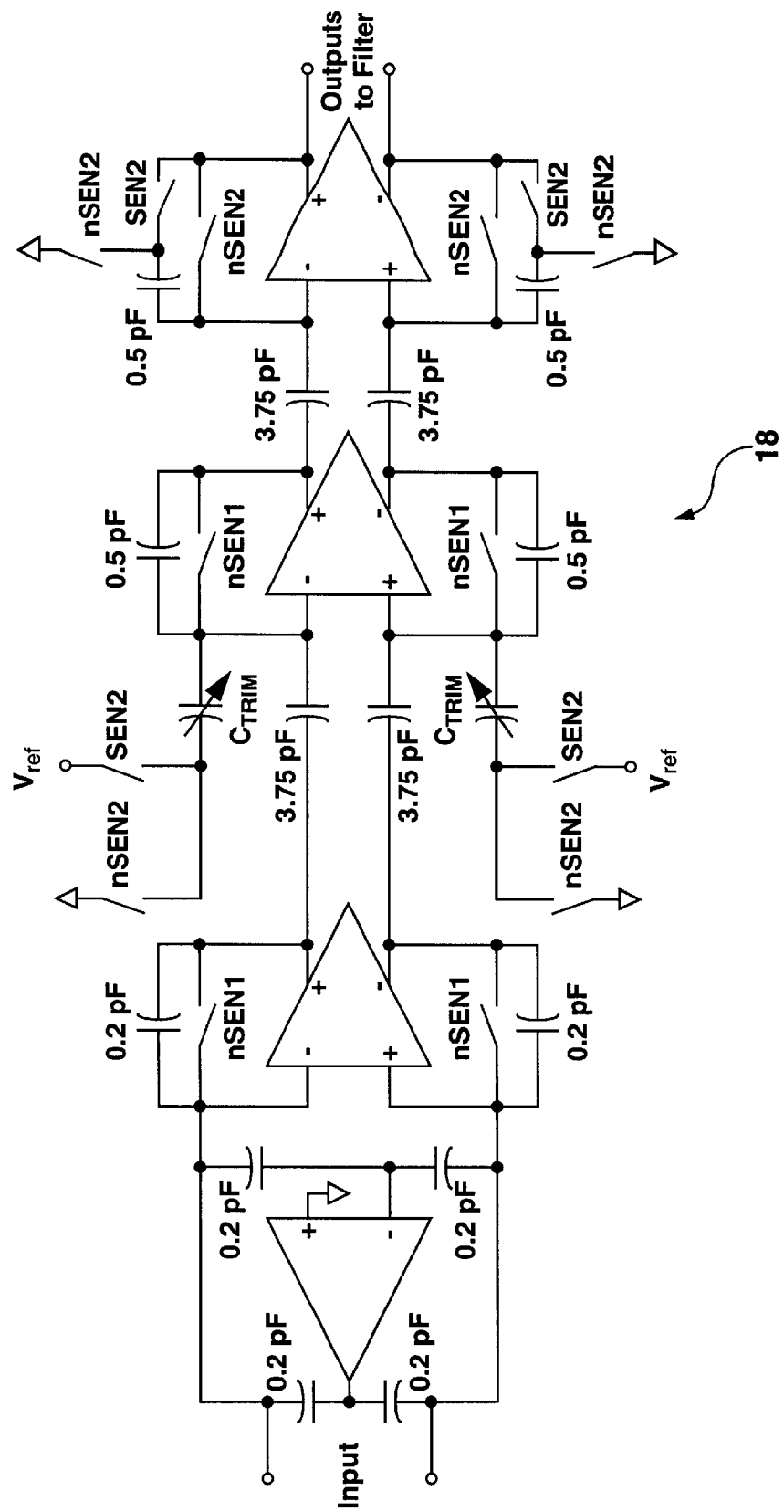
FIG. 3 is a schematic diagram illustrating an example of an amplifier for use in the digital feedback control circuit of the present invention.

The voltage change, ΔV, provided to the proof mass 34 and therefrom to the moveable electrodes 36 capacitively induces a current signal onto the stationary fingers 30 and 32 which is detected and amplified by the amplifier 18. An example of a circuit diagram for the amplifier 18, which includes an input common-mode amplifier to establish a d.c. reference level and additional gain stages to provide about 50×overall amplification, is shown in FIG. 3. This example of the amplifier 18 further includes an offset trim for each input to a first gain stage which can be used to calibrate the MEM accelerometer 10 to account for manufacturing tolerances and to zero out the amplified signal when the proof mass 34 is at rest. After calibration, any movement of the proof mass 34 away from its initial position in response to an applied acceleration will then result in the generation of an amplified signal at the output of the amplifier 18 which provides an indication of the movement of the proof mass 34 from which the applied acceleration can be determined.

In FIG. 3, the amplifier 18 is preferably implemented using capacitors as gain-setting elements. The exact gain for the amplifier 18 will depend upon the signal levels generated from movement of the proof mass 34 over a particular acceleration range. Additionally, transistor switches are provided in parallel with feedback capacitors in each gain stage to reset the gain to zero at the end of each sensing time interval. These gain-resetting switches are in a closed position at time intervals other than "SEN1" (indicated in FIG. 3 by the label "nSEN1") for the first gain stage in FIG. 3, and at time intervals other than "SEN2" (indicated in FIG. 3 by the label "nSEN2") for a second gain stage. This provides an auto-zeroing capability for the amplifier 18.

Returning to FIG. 1, the amplifier 18 is connected to the stationary electrodes 30 and 32 via a pair of digital transistor switches 44 which are closed at all times except during a force-feedback time interval (denoted herein as "FFB" and shown in FIG. 2H) during which time the digital switches 44 are opened so that a feedback signal can be applied to the electrodes 30 and 32 through another pair of digital switches 54 for use in urging the proof mass to return to its initial position when this is necessary. Each digital switch 44 or 54 can comprise, for example, a CMOS transistor. The output of the amplifier 18 is provided to the filter 20 only during the "SEN2" time interval via digital switches which are located in the filter (see FIG. 4). At all other times, the inputs to the filter 20 are electrically grounded via additional digital switches shown in FIG. 4.

In FIG. 1, the filter 20 comprises a notch filter which operates to reject a resonance-frequency component of the electrical signal which is produced by a mechanical resonance (i.e. "ringing") of the proof mass 34, thereby allowing an acceleration signal of interest to be separated from mechanical noise. This improves the precision and accuracy of the ΣΔ feedback control circuit 14.

The notch filter 20 can be implemented passively as a continuous-time (CT) filter (e.g. as a resistor-capacitor notch filter) or actively as a digital notch filter 20. The notch filter 20 provides a pair of complex zeros which are located to coincide with complex poles due to the mechanical resonance (e.g. at about 7 kHz) of the proof mass 34. Thus, the notch filter 20 blocks signals within a predetermined notch bandwidth, Δf, centered about the mechanical resonance frequency, $f_0$, and passes signals at frequencies outside this notch bandwidth. By filtering out the mechanical resonance of the proof mass 34, the noise level in the digital feedback control circuit 14 is substantially reduced, providing an improved precision and accuracy for the MEM accelerometer 10.

Figure 4:
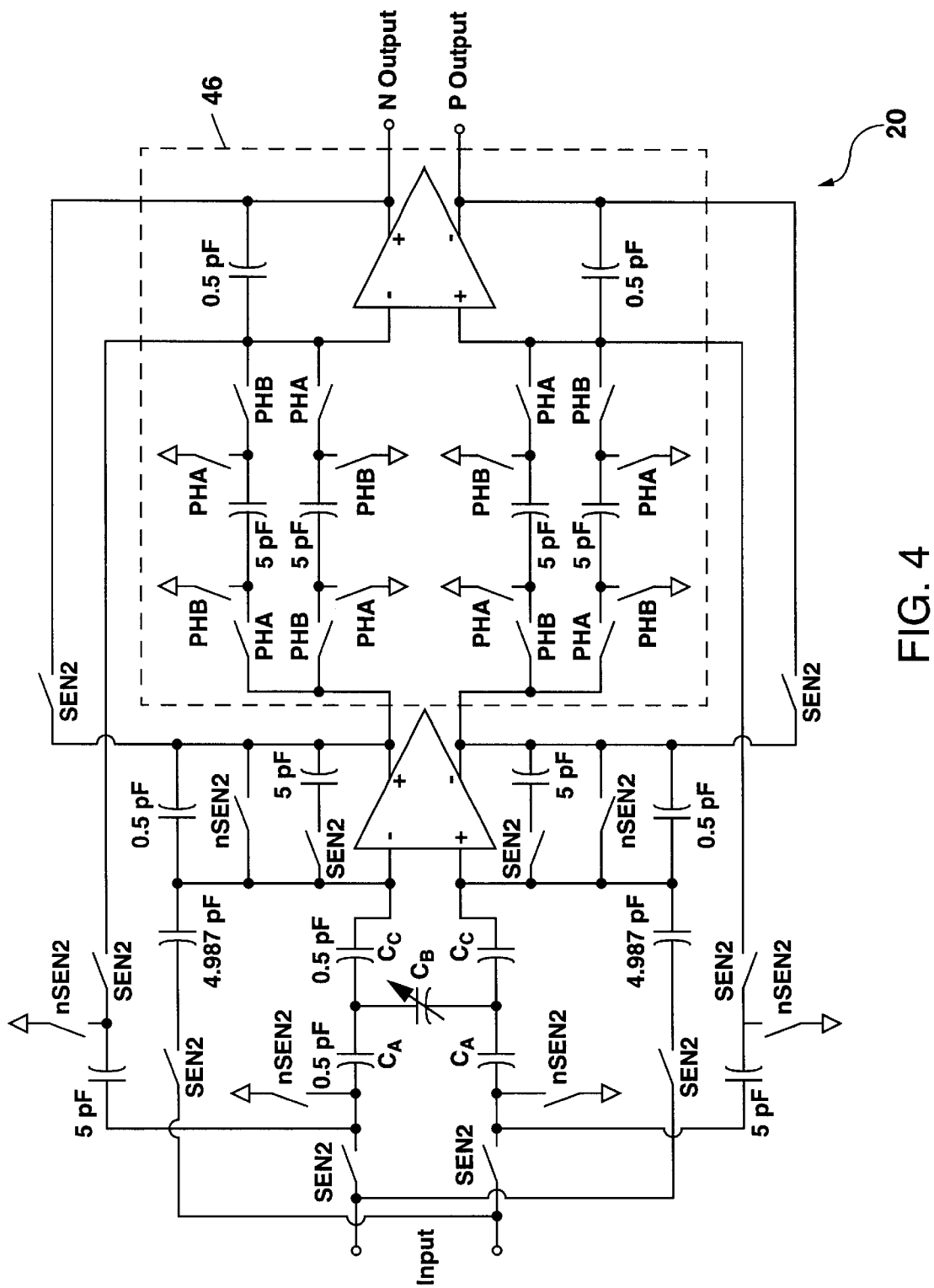
FIG. 4 is a schematic diagram illustrating an example of a filter for use in the digital feedback control circuit of the present invention.

An example of a digital notch filter 20 suitable for use with the present invention is shown in FIG. 4. In FIG. 4, the digital notch filter 20 is shown as a second-order bi-quadratic switched-capacitor filter. The values of filter capacitors $C_A$, $C_B$ and $C_C$ are used to adjust the locations of the complex zeros to block transmission of input signal components within the notch bandwidth, Δf, centered about $f_0$. The provision of an adjustable trim capacitor $C_B$ allows the notch frequency, $f_0$, to be electronically programmed to match the mechanical resonance of the proof mass 34 during manufacture and calibration of the MEM accelerometer 10.

Figure 2:
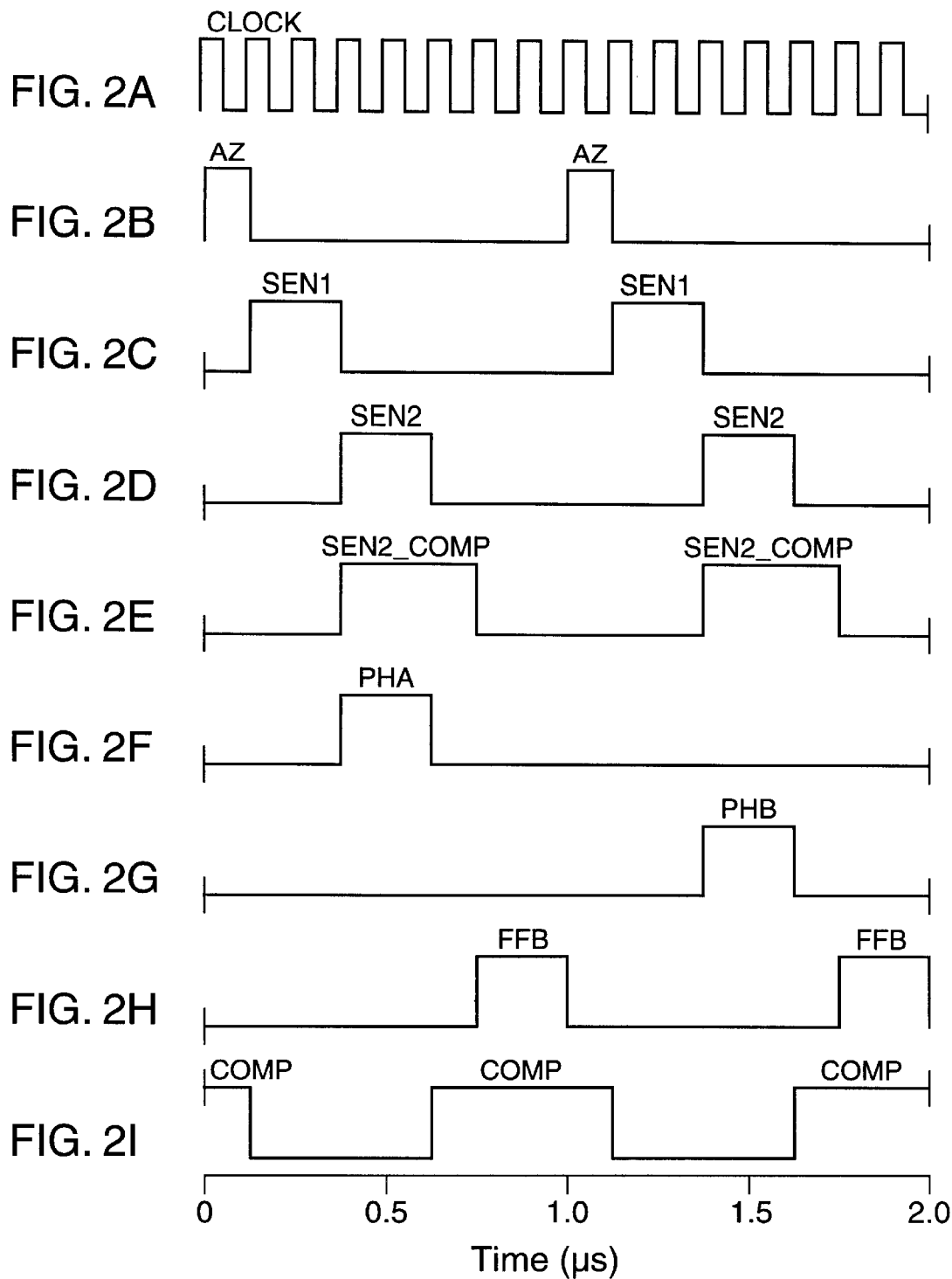
FIGS. 2a–2I show a series of timing diagrams for operation of the single-proof-mass MEM accelerometer of FIG. 1.

The notch filter 20 as shown in the example of FIG. 4 also preferably includes one or more electronic integrators 46 to further improve the stability of the ΣΔ feedback control circuit 14 by smoothing out noise signals within the feedback control circuit 14. This improves tracking and control of the movement of the proof mass 34. The switched-capacitor integrator 46 in the example of FIG. 4 includes switches labelled "PHA" and "PHB" that operate during alternate cycles of the SEN2 timing intervals as shown in FIG. 2 to perform a "pipeline" operation which relaxes the requirements on settling of the amplifier in the integrator 46. Closing of the "PHA" switches occurs during the time interval "PHA" as shown in FIG. 2F; and closing of the "PHB" switches occurs during the time interval "PHB" as shown in FIG. 2G. This allows the digital feedback control circuit 14 to operate at a clock frequency of 4 MHz and to provide an acceleration output at a data rate of 500 kHz (i.e. every 8 clock cycles). In other embodiments of the present invention, the clock frequency can be selected to be in the range of 1–100 MHz.

In the example of FIG. 4, the notch filter 20 provides a filtered output signal which comprises a negative filtered output and a positive filtered output (indicated in FIG. 4 by the labels "N Output" and "P Output", respectively). The output signals from the notch filter 20 are provided to the comparator 22 to generate logic states which control the digital feedback signal for the single-proof-mass MEM accelerometer structure 12 of FIG. 1.

Other types of digital filters 20 can be used in the digital feedback control circuit 14 of the present invention. For example, a flash (i.e. fast) analog-to-digital converter (ADC) capable of rapidly sampling and holding the amplified electrical signal on a microsecond time scale can be used in combination with a digital filter 20 to cancel out the mechanical resonance of the proof mass 34 and thereby provide the filtered signal.

Figure 5:
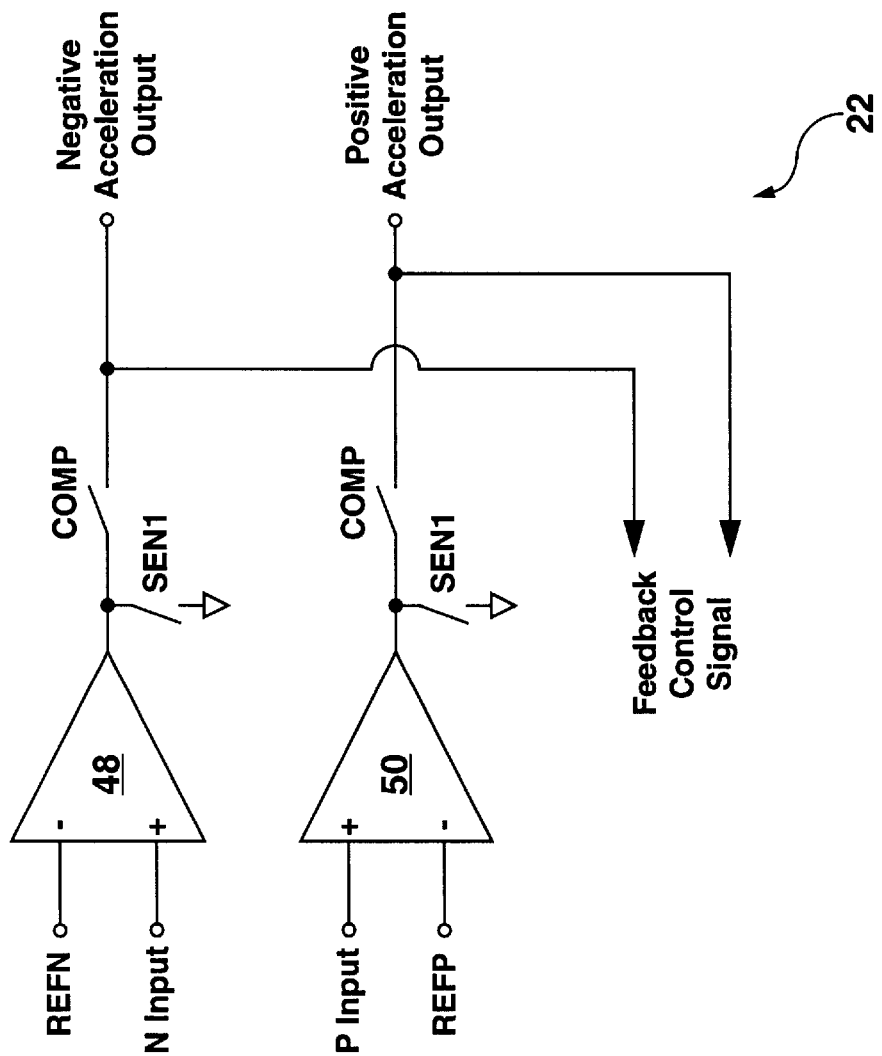
FIG. 5 is a schematic diagram illustrating an example of a comparator for use in the digital feedback control circuit of the present invention.

FIG. 5 shows an example of a three-level comparator 22 for providing three levels of feedback voltages in the digital feedback control circuit 14 depending upon the values of the filtered signals (i.e. the "N output" and "P output" in FIG. 4). In FIG. 5, the three-level comparator 22 comprises a pair of two-level comparators, with one of the two-level comparators 48 being an N-channel comparator 48 connected to the "N Output" of the filter 20 and referenced to a negative voltage reference signal (indicated by "REFN"), and with the other of the two-level comparators 48 being a P-channel comparator 50 connected to the "P Output" of the filter 20 and referenced to a positive voltage reference signal (indicated by "REFP"). The negative and positive reference signals are set to predetermined voltages above the noise floor in the digital feedback control circuit 14, thereby setting an acceleration threshold for measurement and feedback control to the proof mass 34 in the MEM accelerometer 10.

When the "N Output" from the filter 20 is less than the negative voltage reference signal (i.e. "REFN"), which can be set to correspond to a predetermined level of acceleration of the proof mass 34 (e.g. $10^{-3}$ g) in one direction of movement of the proof mass 34, then the output of the N-channel comparator 48 is in a logical "0" state. In the logical "0" state, the N-channel comparator 48 provides no feedback signal to the stationary electrodes 32 during a force-feedback time interval (i.e. "FFB" as shown in FIG. 2H); but instead connects the electrodes 32 to ground electrical potential by triggering one of a pair of digital switches 52 (see FIG. 1). If the "N Output" from the filter 20 is greater than or equal to "REFN", then the output of the N-channel comparator 48 is in a logical "1" state, providing a negative feedback signal which triggers the other digital switch 52 and connects the stationary electrodes 32 to a predetermined feedback voltage (termed "VFB" and generally about 1–2 volts) during the "FFB" time interval. During the "FFB" time interval, an additional switch 54 in FIG. 1 is also closed to route the selected digital feedback signal (either ground electrical potential or "VFB") to the stationary electrodes 32. Finally, a digital switch 56 in FIG. 1 is triggered during the "FFB" time interval and used to connect the proof mass 34 to ground electrical potential during this time interval.

Similarly, the output of the P-channel comparator 50 can be in either a logical "0" state or a logical "1" state depending on whether the "P Output" from the filter 20 is less than "REFP" or greater than or equal to "REFP", indicating that a predetermined threshold has been reached for movement of the proof mass 34 in the other direction. The output of the P-channel comparator 50 controls an additional pair of digital switches 58 to provide a selected digital feedback signal (either ground electrical potential or "VFB") to the stationary electrodes 30 through another digital switch 54 which is closed during the "FFB" time interval.

Whenever the outputs of the comparators 48 and 50 are in different logical states from each other, a non-zero feedback signal is generated and routed to a particular set of the stationary electrodes 30 or 32 to generate an electrostatic force of attraction between the stationary electrodes and the proof mass 34 to urge the proof mass 34 to return to its initial position. However, whenever the outputs of the comparators 48 and 50 are in the same logical state (e.g. a logical "0" state), then a null state (i.e. an "idle" state) of the digital feedback control circuit 14 is generated. In this "idle" state, each set of electrodes 30 and 32 is connected to ground electrical potential since no adjustment to the position of the proof mass 34 is needed. The various possible states of the digital feedback control circuit 14 are summarized in Table 1 below.

TABLE 1

| State of Digital Feedback Signal | Output of N-Channel Comparator | Output of P-Channel Comparator |
| --- | --- | --- |
| First State | "1" | "0" |
| Second State | "0" | "1" |
| Third (Null) State | "0" | "0" |
| Non-Allowed State | "1" | "1" |

In the first state in Table 1, the digital feedback control circuit 14 senses a negative acceleration of the proof mass 34 (i.e. downward in FIG. 1), and therefore applies a feedback voltage "VFB" to the electrodes 30 and a ground electrical potential to the electrodes 32 and the proof mass 34 (and to its moveable fingers 36) during the "FFB" time interval to generate an electrostatic force between the electrodes 30 and the proof mass 34, thereby urging the proof mass 34 upwards towards its initial position. In the second state in Table 1, the digital feedback control circuit 14 senses a positive acceleration of the proof mass 34 (i.e. upwards in FIG. 1), and therefore applies a feedback voltage "VFB" to the electrodes 32 and a ground electrical potential to the electrodes 30 and the proof mass 34 during the "FFB" time interval, thereby urging the proof mass 34 downwards towards its initial position. In the third state in Table 1 (termed herein a null or "idle" state), the digital feedback control circuit 14 senses that the proof mass 34 is unchanged in position and thus has not experienced any acceleration above the predetermined threshold level. In this "idle" state, each of the electrodes 30 and 32 and the proof mass 34 are electrically grounded during the "FFB" time interval so that no electrostatic force is generated, thereby urging the proof mass 34 to remain in place during this time interval.

In practice, the outputs of the N-channel comparator 48 and the P-channel comparator 50 cannot be simultaneously in the logical "1" state since this is a non-allowed state which would require the proof mass 34 to be accelerating in opposite directions at the same time. However, there are many instances when the outputs of the N-channel comparator 48 and the P-channel comparator 50 will both be in the logical "0" state since this "idle" state occurs whenever the acceleration experienced by the MEM accelerometer 10 falls below a certain predetermined "threshold" level. By providing an "idle" state for the MEM accelerometer 10 of the present invention, cumulative errors in positioning can be reduced compared to other accelerometers not having an "idle" state. Thus, the present invention provides an advance over prior MEM accelerometers known to the art.

In FIG. 5, a pair of switches labelled "COMP" are used to allow the digital feedback signal and acceleration outputs from the three-level comparator 22 to be routed only during a comparator time interval (termed "COMP" and shown in the timing diagram of FIG. 2I). As a result, the negative and positive acceleration outputs and feedback signals from the three-level comparator 22 appear as a series of pulses (i.e. a digital bit stream at a data rate of, for example, 500 kHz), with the sign and frequency of the pulses providing an indication of the direction and magnitude of the acceleration experienced by the MEM accelerometer 10 in the example of FIG. 1. These output pulses are used to control the operation of the pairs of digital switches 52 and 58. Additionally, the output pulses can be digitally counted, accumulated and analyzed over time to provide a measure of the acceleration (deceleration) experienced by the MEM accelerometer 10 for navigation. Use of the three-level comparator 22 also allows an adjustable "dead zone" to be provided about a "zero-g" acceleration condition which is advantageous for reducing the effects of noise in the MEM accelerometer 10 and for compensating for manufacturing tolerances in the MEM accelerometer structure 12, especially in embodiments of the present invention employing two proof masses 34. No acceleration information is lost as a result of the "dead zone" since the integrator in the filter 20 accumulates the acceleration information until it becomes sufficient to trigger the comparator 22 and produce an output pulse which can be counted.

Although FIG. 5 shows a three-level comparator 22, it will be understood by those skilled in the art that comparators with an odd number of levels greater than three can be used in the digital feedback control circuit 14 of the present invention. For example, a five-level comparator can be used to provide two levels (i.e. two different feedback voltages) of feedback control in each of the forward and reverse directions of motion of the proof mass 34, and a "null" state when no active control of the position of the proof mass 34 is needed. As another example, a multi-level comparator 22 can be used to route a fixed value of the feedback voltage (e.g. 2 volts) to different combinations of the stationary electrodes 30 or 32 to provide different levels of electrostatic force to urge the proof mass 34 back towards its initial position depending upon the value of the filtered signal detected by the multi-level comparator 22. This can be done by using the state of the multi-level comparator 22 to address different combinations of the stationary electrodes 30 or 32 for different values of the filtered signal sensed by the multi-level comparator 22.

After each force-feedback ("FFB") time interval, an auto-zero time interval (denoted as "AZ" and shown in FIG. 2A) is provided during which the proof mass 34 is electrically grounded through switch 60 in FIG. 1 immediately prior to providing the first measurement voltage "VSA" during the "SEN1" time interval. Additionally, during the "AZ" time interval and at other times as indicated in FIGS. 3–5 electrical offsets in the digital feedback control circuit 14 (e.g. due to stored electrical charges on capacitors) are nulled.

Figure 6:
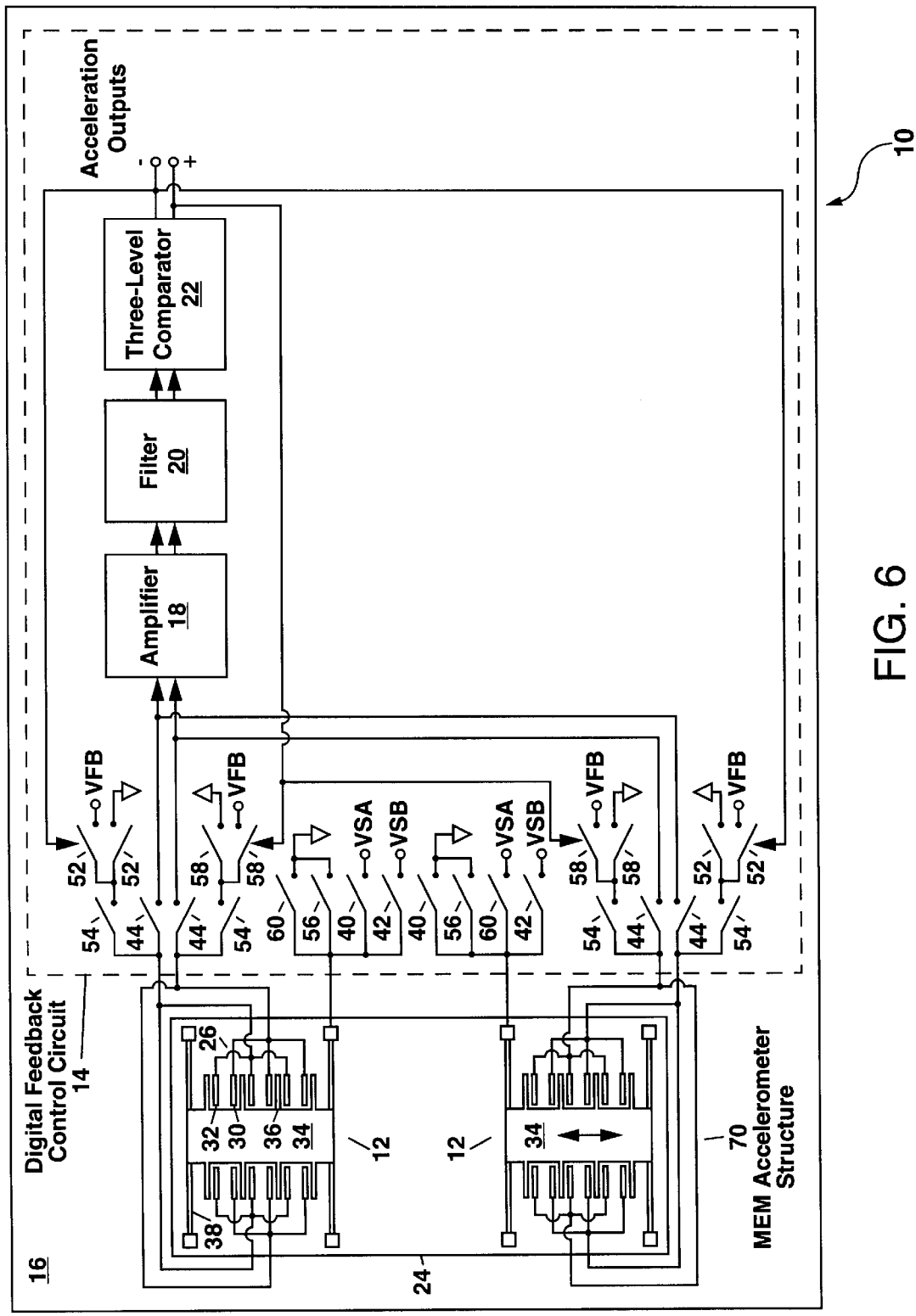
FIG. 6 shows schematically an example of a dual-proof-mass MEM accelerometer including the digital feedback control circuit of the present invention.

FIG. 6 shows schematically a second example of an integrated microelectromechanical (MEM) accelerometer 10 according to the present invention. The MEM accelerometer 10 in FIG. 6 comprises a dual-proof-mass MEM accelerometer structure 70, and a digital feedback control circuit 14 similar to that of FIG. 1.

In the example of FIG. 6, the dual-proof-mass MEM accelerometer structure 70 can be formed from a pair of oppositely connected single-proof-mass MEM accelerometer structures 12 as described previously with reference to FIG. 1. These two structures 12 can be located within a common cavity 24 etched into a silicon substrate 16. The use of two proof masses 34 in the oppositely-connected structure 70 is advantageous since a two-times-larger difference component in the electrical signals generated by the two proof masses 34 is detected and amplified while common-mode signals, including those due to electrical noise, Brownian motion and thermal effects, are effectively cancelled out. This results in an electrical signal generated by an applied acceleration that is twice that for the device 10 of FIG. 1 for a given size proof mass 34, while having a smaller noise floor. As a result, the sensitivity and accuracy of the integrated MEM accelerometer 10 of FIG. 6 is expected to be higher than that of FIG. 1. Furthermore, common-mode input requirements for the amplifier 18 are relaxed since the common-mode signals are effectively cancelled out in the device 10 of FIG. 6.

Operation of the digital feedback control circuit 14 in FIG. 6 is similar to that described with reference to FIGS. 1 and 2. Digital switches 44 are closed to connect the stationary electrodes 30 and 32 of each MEM accelerometer structure 12 to amplifier 18 at all times except during the force-feedback ("FFB") time interval. Electrical connections to the proof masses 34 are made through suspension springs 38, with the proof masses 34 being oppositely biased during the "SEN1" and "AZ" time intervals in order to cancel out common mode signals during these time intervals. The electrical signal capacitively generated by motion of the proof masses 34 in response to an applied acceleration is coupled into the amplifier 18 where it is amplified. The amplifier 18 can be as shown in the example of FIG. 3.

Subsequently, during the "SEN2" time interval the amplified electrical signal is filtered by filter 20 to remove at the resonance-frequency components of the electrical signal produced by the mechanical resonances of each of the proof masses 34 and then integrated. The resonance frequencies of the proof masses 34 are preferably substantially identical so that a notch filter 20 can be used as shown, for example, in FIG. 4. However, there can be slight differences in the resonance frequencies due to manufacturing tolerances so that the position or width of the notch bandwidth, Δf, of the filter 20 may need to be adjusted.

The filtered signal can then be used to drive a comparator 22 such as that shown in the example of FIG. 5 to generate one of three states as described previously for providing feedback to electrostatically control the position of each proof mass 34 during the "FFB" time interval and, if necessary, to urge the proof masses 34 to return to their initial positions. The positive and negative feedback signals generated by the comparator 22 are provided to control a plurality of pairs of digital switches 52 and 58 which connect each stationary electrode 30 and 32 to either ground electrical potential or to a feedback voltage ("VFB") during the "FFB" time interval. Positive and negative acceleration outputs are also provided by the comparator 22 for use in measuring and quantifying the acceleration experienced by the integrated MEM accelerometer 10.

Other embodiments of the integrated MEM accelerometer 10 and the digital feedback control circuit 14 are possible. For example, although the MEM accelerometer structures 12 and 70 in FIGS. 1 and 6 are shown formed within a cavity 24 etched into the substrate 16, these structures 12 and 70 can also be formed above the substrate 16 using surface micromaching processes. Furthermore, although the digital feedback control circuit 14 in the examples of FIGS. 1 and 6 is shown fabricated on the same substrate 16 as the MEM accelerometer structures 12 and 70 for optimum sensitivity, in other embodiments of the present invention, the digital feedback control circuit 14 can be located, in part or entirely, off the substrate 16 and electrically connected to the structures 12 or 70. Finally, multiple integrated MEM accelerometers 10 can be fabricated on a single semiconductor substrate 16 for use in sensing acceleration in different directions.

The matter set forth in the foregoing description and accompanying drawings is offered by way of illustration only and not as a limitation. Other applications and variations of the present invention will become evident to those skilled in the art. The digital feedback control circuit 14 of the present invention can be used with many different types of accelerometers as known to the art, including electron tunneling accelerometers (in which an acceleration is sensed through electronic tunneling between a proof mass and an adjacent electrical contact structure) and "see-saw" accelerometers (in which acceleration is capacitively sensed from movement of a beam supported near its center and having electrodes below the beam on each end thereof). Additionally, the digital feedback control circuit 14 of the present invention can be used in accelerometers having many different configurations and sensing mechanisms (e.g. optical, capacitive, resistive, piezoelectric, tunneling etc.) for determining the position of one or more proof masses, and with many different force-feedback mechanisms (e.g. electrostatic, electromagnetic, piezoelectric etc.) for urging the proof masses back towards their initial positions. The actual scope of the invention is intended to be defined in the following claims when viewed in their proper perspective based on the prior art.

What is claimed is:

1. A digital feedback control circuit for use with an accelerometer structure having at least one proof mass which is moveable away from an initial position in response to an acceleration provided thereto, comprising:
    (a) an amplifier operatively connected to sense the motion of each proof mass and generate therefrom an amplified signal indicative of the magnitude and direction of the movement of each proof mass;
    (b) a filter connected to the amplifier to receive the amplified signal and generate therefrom a filtered signal substantially free from a resonant-frequency component in the amplified signal resulting from a mechanical resonance of each proof mass; and
    (c) a comparator to receive the filtered signal and a voltage reference signal and generate therefrom a digital feedback signal which is operatively coupled back to each proof mass during a force-feedback time interval to urge the proof mass towards the initial position, the feedback signal being in one of three states during the force-feedback time interval, including a first state wherein the feedback signal urges each proof mass in one direction, a second state wherein the feedback signal urges each proof mass in the opposite direction, and a third state wherein the feedback signal is substantially equal to zero and does not urge each proof mass in either direction.

2. The digital feedback control circuit of claim 1 wherein the amplifier comprises a differential amplifier for generating an amplified output signal in response to the motion of a pair of proof masses in the accelerometer.

3. The digital feedback control circuit of claim 1 wherein the amplifier includes an offset trim to zero out the amplified signal when the proof mass is at rest, thereby calibrating the accelerometer structure.

4. The digital feedback control circuit of claim 1 wherein the filter comprises a digital filter.

5. The digital feedback control circuit of claim 4 wherein the digital filter comprises a switched-capacitor filter.

6. The digital feedback control circuit of claim 5 wherein the switched-capacitor filter is a notch filter programmable to reject the resonance frequency component of the amplified signal.

7. The digital feedback control circuit of claim 5 wherein the switched-capacitor filter further includes at least one electronic integrator.

8. The digital feedback control circuit of claim 1 wherein the comparator has an odd number of levels greater than or equal to three.

9. The digital feedback control circuit of claim 8 wherein the comparator is a three-level comparator.

10. The digital feedback control circuit of claim 9 wherein the amplifier, filter and three-level comparator are each formed from a plurality of interconnected transistors.

11. The digital feedback control circuit of claim 10 wherein the transistors comprise complementary metal-oxide semiconductor (CMOS) transistors.

12. The digital feedback control circuit of claim 1 wherein the accelerometer structure is a microelectromechanical (MEM) accelerometer structure formed on a semiconductor substrate.

13. The digital feedback control circuit of claim 12 further comprising digital signal routing circuitry that routes electrostatic signals from a plurality of electrodes adjacent to each proof mass to the amplifier during a position-sense time interval, and routes the digital feedback signal to the electrodes during the force-feedback time interval.

14. The digital feedback control circuit of claim 12 wherein the amplifier, filter and comparator are each formed on the semiconductor substrate containing the MEM accelerometer structure.

15. A microelectromechanical (MEM) accelerometer comprising:
    (a) at least one suspended proof mass formed on a semiconductor substrate, with each proof mass being moveable away from an initial position in response to an applied acceleration;
    (b) electrodes located on the substrate proximate to each proof mass to capacitively generate an electrical signal indicative of the magnitude and direction of the acceleration of the proof mass;
    (c) a filter for receiving the electrical signal generated at the electrodes by the acceleration of each proof mass and generating therefrom a filtered signal having a resonance-frequency component of the electrical signal produced by a mechanical resonance of each proof mass removed; and
    (d) electrical feedback means, electrically connected between the filter and the electrodes, for providing a feedback signal generated from the filtered signal to urge each proof mass towards its initial position after movement in response to the acceleration, the electrical feedback means operating digitally in response to a clock and providing the feedback signal to the electrodes during a force-feedback time interval, with the feedback signal during the force-feedback time interval being in one of three states, including a first state wherein the feedback signal urges each proof mass in one direction, a second state wherein the feedback signal urges each proof mass in the opposite direction, and a third state wherein the feedback signal is nulled and does not urge each proof mass in either direction.

16. The MEM accelerometer of claim 15 further including an amplifier connected between the electrodes and the filter to amplify the electrical signal prior to filtering.

17. The MEM accelerometer of claim 16 wherein the amplifier further includes an offset trim to zero out the amplified electrical signal when the proof mass is at rest, thereby calibrating the accelerometer.

18. The MEM accelerometer of claim 15 wherein the filter comprises a digital filter.

19. The MEM accelerometer of claim 18 wherein the digital filter comprises a switched-capacitor filter.

20. The MEM accelerometer of claim 19 wherein the switched-capacitor filter is a notch filter programmable to reject the resonance-frequency component of the electrical signal.

21. The MEM accelerometer of claim 19 wherein the switched-capacitor filter further includes at least one electronic integrator.

22. The MEM accelerometer of claim 15 wherein the electrical feedback means comprises a comparator having an odd number of levels greater than or equal to three.

23. The MEM accelerometer of claim 22 wherein the electrical feedback means comprises a three-level comparator.

24. The MEM accelerometer of claim 15 wherein a clock frequency is in a range of 1–100 MHz.

25. The MEM accelerometer of claim 15 wherein the filter and electrical feedback means are formed on the semiconductor substrate.

26. The MEM accelerometer of claim 25 wherein the filter and the electrical feedback means each comprise complementary metal-oxide semiconductor (CMOS) or bipolar circuitry.

27. The MEM accelerometer of claim 15 wherein each proof mass is located, at least in part, within a cavity formed in the semiconductor substrate.

28. A microelectromechanical (MEM) accelerometer comprising:
   (a) a pair of suspended proof masses formed on a semiconductor substrate, with each proof mass being moveable in the same direction away from an initial position in response to an applied acceleration;
   (b) electrodes located on the substrate proximate to each proof mass to capacitively generate an electrical signal indicative of the magnitude and direction of the acceleration of the proof mass;
   (c) a differential amplifier connected to the electrodes to amplify a difference component in the electrical signal generated by the pair of proof masses, thereby generating an amplified electrical signal;
   (d) a filter for receiving the amplified electrical signal from the differential amplifier and generating therefrom a filtered signal having a resonance-frequency component of the electrical signals produced by mechanical resonances of the proof masses removed; and
   (e) electrical feedback means, electrically connected between the filter and the electrodes, for providing a feedback signal generated from the filtered signal to urge each proof mass towards an initial position after movement in response to the acceleration, the electrical feedback means operating digitally in response to a clock and providing the feedback signal to the electrodes during a force-feedback time interval, with the feedback signal during the force-feedback time interval being in one of three states, including a first state wherein the feedback signal urges each proof mass in one direction, a second state wherein the feedback signal urges each proof mass in the opposite direction, and a third state wherein the feedback signal is nulled and does not urge the proof masses in either direction.

29. The MEM accelerometer of claim 28 wherein the substrate comprises silicon.

30. The MEM accelerometer of claim 28 wherein the differential amplifier includes an offset trim to zero out the amplified electrical signal when the proof masses are at rest, thereby calibrating the accelerometer.

31. The MEM accelerometer of claim 28 wherein the filter further includes at least one electronic integrator.

32. The MEM accelerometer of claim 28 wherein the filter comprises a digital filter.

33. The MEM accelerometer of claim 32 wherein the digital filter comprises a switched-capacitor filter.

34. The MEM accelerometer of claim 28 wherein the electrical feedback means comprises a comparator having an odd number of levels greater than or equal to three.

35. The MEM accelerometer of claim 34 wherein the electrical feedback means comprises a three-level comparator.

36. The MEM accelerometer of claim 28 wherein the differential amplifier, filter and electrical feedback means are formed on the semiconductor substrate.

37. A method for operating an accelerometer to sense an acceleration of a proof mass therein, comprising steps for:
   (a) sensing a movement of the proof mass from an initial position due to the acceleration, and generating an electrical signal containing information about the position of the proof mass at particular instants in time;
   (b) filtering the electrical signal to remove a resonant-frequency component thereof arising from a mechanical resonance of the proof mass and thereby generating a filtered signal;
   (c) comparing the filtered signal to a voltage reference signal and generating a feedback signal comprising digital voltage pulses having one of three states during a force-feedback time interval, including a first state for urging the proof mass in a forward direction, a second state for urging the proof mass in a reverse direction, and a third state for providing a null signal and thereby urging the proof mass to remain in place; and
   (d) generating an indication of the acceleration from the feedback signal.

38. The method of claim 37 further including a step for amplifying the electrical signal prior to the step for filtering the electrical signal.

39. The method of claim 38 further including a step for zeroing out the amplified electrical signal with an amplifier offset trim when the proof mass is at rest.

40. The method of claim 38 wherein the step for filtering the electrical signal to remove the resonant component comprises filtering the electrical signal with a notch filter.

41. The method of claim 40 wherein the notch filter comprises a digital filter.

42. The method of claim 41 wherein the digital filter comprises a switched-capacitor filter.

43. The method of claim 37 wherein the step for comparing the filtered signal to a voltage reference signal comprises comparing the filtered signal with a three-level comparator.

44. The method of claim 37 wherein the step for comparing the filtered signal to a voltage reference signal comprises comparing the filtered signal with a comparator having an odd number of levels greater than or equal to three.

45. The method of claim 37 wherein the accelerometer is a microelectromechanical (MEM) accelerometer and the feedback signal is electrostatically coupled to the proof mass to urge the proof mass to return to the initial position as needed.

46. The method of claim 37 wherein the step for generating the indication of the acceleration from the feedback signal comprises counting the digital voltage pulses.

* * * * *